(12) United States Patent
Barabi et al.

(10) Patent No.: US 8,493,085 B2
(45) Date of Patent: Jul. 23, 2013

(54) SPRING CONTACT PIN FOR AN IC TEST SOCKET AND THE LIKE

(75) Inventors: Nasser Barabi, Lafayette, CA (US); Oksana Kryachek, San Francisco, CA (US); Chee-Wah Ho, Fremont, CA (US)

(73) Assignee: Essai, Inc., Fremont, CA (US)

( * ) Notice: Subject to any disclaimer, the term of this patent is extended or adjusted under 35 U.S.C. 154(b) by 413 days.

(21) Appl. No.: 12/749,297

(22) Filed: Mar. 29, 2010

(65) Prior Publication Data

US 2010/0277191 A1    Nov. 4, 2010

Related U.S. Application Data

(60) Provisional application No. 61/164,335, filed on Mar. 27, 2009.

(51) Int. Cl.
*G01R 31/20* (2006.01)
(52) U.S. Cl.
USPC ............. 324/754.11; 324/754.14; 324/755.05

(58) Field of Classification Search
None
See application file for complete search history.

(56) References Cited

U.S. PATENT DOCUMENTS

| | | | |
|---|---|---|---|
| 4,161,692 A | 7/1979 | Tarzwell | |
| 5,523,696 A | 6/1996 | Charlton et al. | |
| 5,557,213 A | 9/1996 | Reuter et al. | |
| 5,600,259 A | 2/1997 | Bartyzel et al. | |
| 6,208,155 B1 | 3/2001 | Barabi et al. | |
| 6,773,312 B2 | 8/2004 | Bauer et al. | |
| 7,114,996 B2 * | 10/2006 | Goodman et al. | 439/700 |
| 2007/0018666 A1 | 1/2007 | Barabi et al. | |

* cited by examiner

*Primary Examiner* — Minh N Tang
(74) *Attorney, Agent, or Firm* — Donald L. Beeson; Beeson Skinner Beverly, LLP

(57) ABSTRACT

A spring contact pin includes a depressible probe member having a tapered configuration that prevents contact between the projecting end of the probe member and the end of the spring barrel throughout the compression and release cycle of the probe. The tapered configuration of the depressible probe member improves the mechanical performance, reliability, and high-speed signal performance of the contact pin.

11 Claims, 6 Drawing Sheets

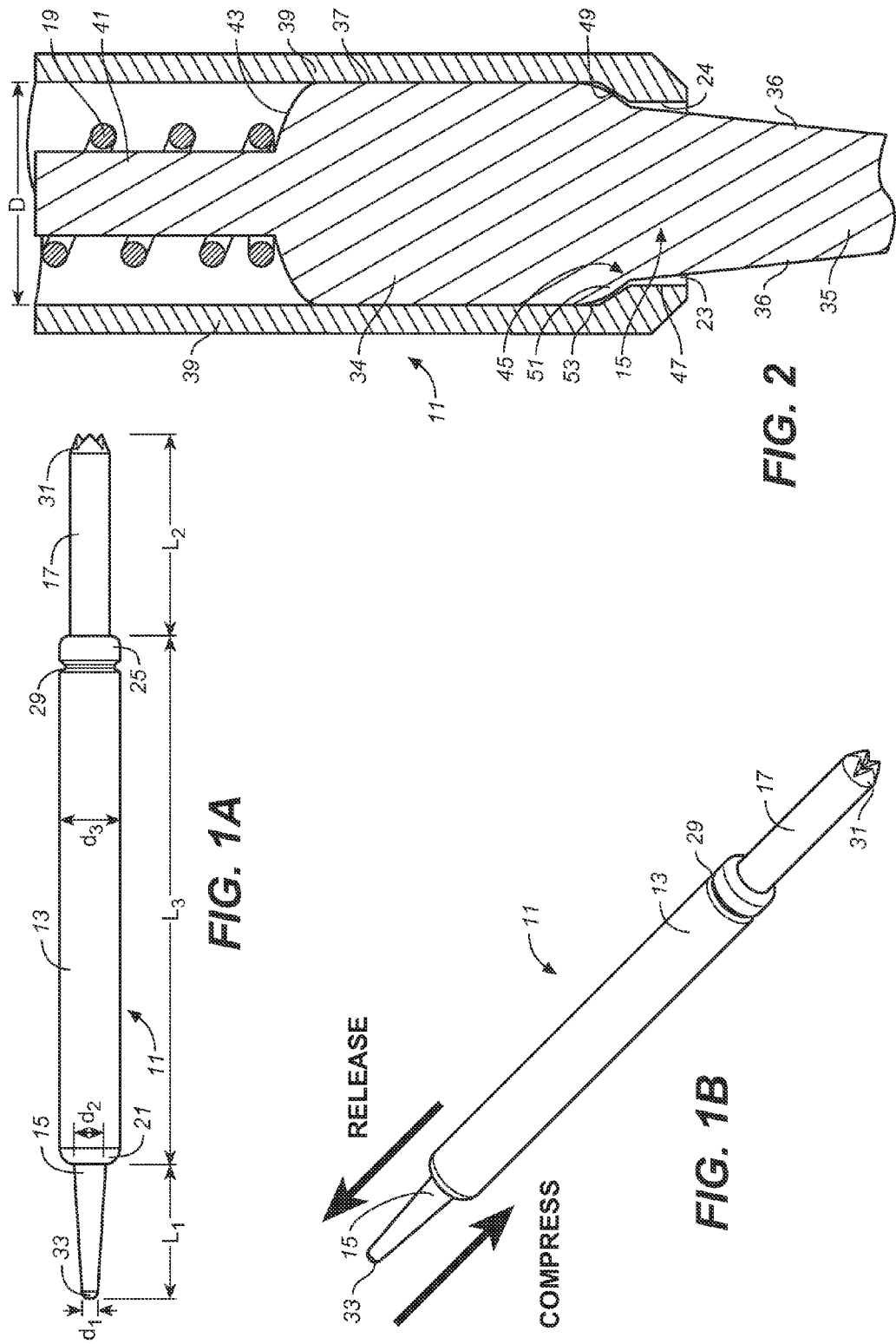

| Package Pitch | Applications Frequency | Differential Signaling [Unit: dB] | | | |
|---|---|---|---|---|---|
| | | Insertion Loss (IL) | Return Loss (RL) | Near End XTalk (NEXT) | Far End XTalk (FEXT) |
| 0.5mm | 3.2GHz | -0.16 | -14.90 | -50.55 | -57.48 |
| | 5.0GHz | -0.36 | -11.34 | -47.07 | -52.86 |
| | 8.0GHz | -0.79 | -8.00 | -43.75 | -47.08 |
| | 10.0GHz | -1.08 | -6.50 | -42.08 | -44.17 |
| 0.6 / 0.7mm | 3.2GHz | -0.07 | -20.93 | -57.39 | -50.95 |
| | 5.0GHz | -0.11 | -17.13 | -53.62 | -47.19 |
| | 8.0GHz | -0.24 | -13.08 | -48.33 | -42.92 |
| | 10.0GHz | -0.35 | -11.54 | -45.83 | -41.25 |
| 0.8mm | 3.2GHz | -0.06 | -21.24 | -71.89 | -50.64 |
| | 5.0GHz | -0.11 | -17.77 | -64.25 | -46.85 |
| | 8.0GHz | -0.22 | -14.06 | -55.00 | -44.38 |
| | 10.0GHz | -0.31 | -12.50 | -51.25 | -41.25 |
| 1.0mm | 3.2GHz | -0.04 | -21.82 | -79.58 | -52.04 |
| | 5.0GHz | -0.08 | -18.38 | -70.09 | -48.24 |
| | 8.0GHz | -0.17 | -14.47 | -58.95 | -44.58 |
| | 10.0GHz | -0.25 | -13.29 | -53.95 | -42.92 |

*FIG. 6*

SPRING CONTACT PIN FOR AN IC TEST SOCKET AND THE LIKE

CROSS-REFERENCE TO RELATED APPLICATIONS

This application claims the benefit of U.S. provisional application No. 61/164,335 filed Mar. 27, 2009, which is incorporated herein by reference.

BACKGROUND

The present invention generally relates to test sockets and contactors for testing and burn-in of integrated circuit (IC) devices, and more particularly to spring contact pins used in test sockets and contactors to make circuit connections between an IC device and a test or burn-in circuit board. IC devices will sometimes be referred to herein as simply a "chip."

To facilitate testing and burn-in, test sockets and contactors have been designed for holding IC chip packages and connecting and disconnecting the chip's I/O contacts to a printed circuit (PC) test board, such as used in an automated chip tester. Such chip holding devices commonly use tiny spring contact pins—whose length is measured in millimeters—to achieve an electrical connection between the chip and PC test board. The spring contact pins have a depressible probe or plunger end at one or both ends of a conductive spring barrel and are provided in densely packed arrays in a thin contact wall of the socket or contactor; they are intended to provide an efficient electrical path between IC chip and test PC test board.

As leadless IC devices, such as BGA, LGA and SGAs, have become smaller and their input/output (I/O) densities larger, the challenge of creating test and burn-in sockets having desired and repeatable performance characteristics has increased. Because of the extremely small dimensions of the test socket's spring contact pins, any slight mechanical friction between the components of the contact pins will have a negative effect on the contact pin's mechanical and electrical performance, and will negatively affect the ability of the contact pins to perform consistently over the life of the contact pins, which are subjected to many thousands of test cycles during the expected life of the contact pins.

SUMMARY OF THE INVENTION

The invention is directed to an improved spring contact pin for IC test sockets or contactor having a uniquely designed depressible probe member that allows the probe member to repeatedly cycle through compression and release motions without experiencing frictional forces encountered at the end of the spring barrel, which in conventional spring contact pins, degrades the performance and longevity of the spring contact pins. Elimination of these frictional forces in the improved spring contact pin of the invention results in smooth actuation with a repeatable force profile and with a maximum force transfer onto contacted conductor surfaces of a test or burn-in board. The improved spring contact pin of the invention also provides for consistent and predictable pin resistance over a longer life cycle, and prevents jammed actuation of the spring contact pins, such as experienced in conventional pin designs.

In accordance with the invention, the depressible probe member of the spring contact pin is provided with a unique tapered configuration that prevents the depressible probe member from contacting the end of the spring barrel through which it extends.

DESCRIPTION OF THE DRAWINGS

FIG. 1A is a side-elevational view of a spring contact pin in accordance with the invention.

FIG. 1B is a perspective view thereof.

FIG. 2 is a fragmentary cross-sectional view thereof.

FIG. 6 is a table showing measured parameters for establishing the high frequency signal performance of IC test sockets using spring contact pins in accordance with the invention.

DESCRIPTION OF ILLUSTRATED EMBODIMENT

Figure 3:
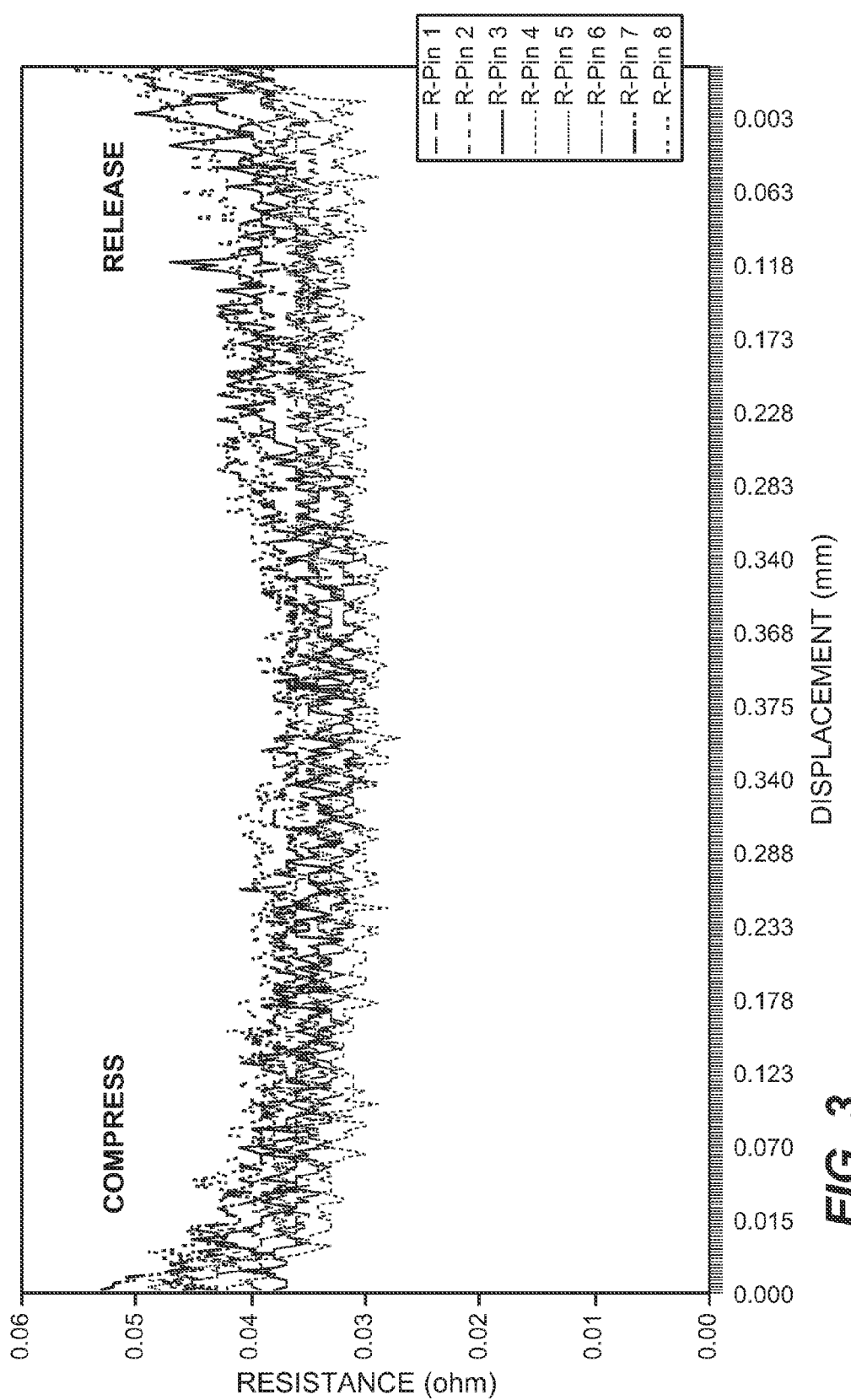
FIG. 3 is a graph showing measured electrical resistance as a function of the displacement of the depressible probe member of spring contact pins in accordance with the invention.

Referring now to the drawings, FIGS. 1A, 1B, and 2 illustrate an exemplary spring contact pin in accordance the invention comprised of a cylindrical conductive spring barrel 13, conductive probe members 15, 17, and a compression spring 19 inside the spring barrel. The spring barrel has opposite barrel ends, designate the first barrel end 21 and second barrel end 25. Probe member 15 is seen to project from a first barrel end 21 of the spring barrel through barrel end opening 23, whereas the opposite probe member 17 projects through the second barrel end 25 through barrel end opening 27. In the illustrated embodiment, probe member 15 is a depressible probe member, which can be depressed into and released from the spring probe barrel in a compress and release cycle indicated by the direction arrows in FIG. 1B. Probe member 17, on the other hand, is suitably a fixed probe member held in its fixed position by a crimp 29 in the barrel wall at the barrel end 25. Fixed probe member 17 is shown as having a crown tip end 31, which is most suitably used for engaging the I/O contacts of a BGA device, but which could also be used for testing LGA, SGA and other IC devices. The depressible probe member 15 at the opposite end of the spring contact is shown as having a rounded tip end 33, suitable for contacting leads of a PC test or burn-in board. It will be understood that spring contacts in accordance with the invention are not limited to spring contacts having probes with particular probe tip configurations, nor is the invention limited to spring contacts having a fixed probe and a depressible probe. For example, both of the probes of a spring contact could have a rounded end, and both of the probes could be depressible probe members.

The invention resides in the construction of the depressible probe 15 of the illustrated spring contact pin, the unique characteristics of which improve the mechanical performance, reliability, and high-speed signal performance of the contact pin. As best seen in FIG. 2, the depressible probe member 15 has an enlarged base end 34 captured within the spring barrel 13, and a tapered projecting end that extends from the base end through the spring barrel opening 23. The base end of the probe member has a diameter that is only slightly smaller than the inside diameter D of the spring barrel, such that the outer cylindrical wall 37 of the probe base is in contact with the barrel walls 39 to permit current flow between the barrel walls and the probe member. The back of the probe base can suitably be provided with a center extension member 41 having a diameter that allows one end of the barrel spring 19 to fit over the extension member. This extension member will act to center the compression spring, which contacts the rear shoulder 43 at the back end of the probe.

The projecting end 35 of the probe member is seen to have sidewalls 36 that gradually taper from a terminal point 45 within the spring barrel, where the probe begins to enlarge into the enlarged base end contained within the spring barrel. Referring to FIG. 2, it can be seen that such a gradual taper creates an enlarged gap between the inside wall 24 of the barrel end opening 23 that will prevent the projecting end of the probe from contacting the barrel end at any point during the compression and release cycle of the probe member. It is further seen that the barrel opening 23 is formed by an inwardly projecting portion 47 of the barrel end that forms a stop wall 49, which the forward shoulder 51 of probe base 34 contacts when the probe member 15 is in its full, extended (released) position. Preferably, the forward shoulder 51 of the probe base has a radius 53 to facilitate the movement of the probe member in the spring barrel.

The taper of the projecting end 35 of probe member 15 preferably has a substantially continuous taper and preferably decreases in diameter substantially at a uniform rate from the terminal point 45 at the beginning of the enlargement of the probe member's base end to the probe member's tip 33. Generally, it is desirable to keep both probe members 15, 17, as well as the spring barrel as short as possible. Referring to FIG. 1A, the following are exemplary dimensions for the spring contact pin:

| | |
|---|---|
| Length of projection of depressible probe 15 (L1) | 0.85 mm |
| Length of projection of fixed probe 17 (L2) | 1.27 mm |
| Length of spring barrel 13 (L3) | 3.33 mm |
| Diameter of projecting end of probe 15 at end of taper ($d_1$) | 0.10 mm |
| Diameter of projecting end of probe 15 at barrel entry when probe fully extended ($d_2$) | 0.20 mm |
| Diameter of spring barrel ($d_3$) | 0.38 mm |

The above dimensions produce a spring contact pin having an overall length of 5.45 mm when the projecting end of probe member 15 is extended. They have also been found to produce component dimension ratios that result in optimal mechanical performance, reliability and optimal ability to meet high speed signal requirements.

Suitable materials for the spring contact pin components are nickel or gold plated beryllium copper for spring barrel 13 and depressible probe member 15, hardened SK4 steel for the fixed probe member 17. The crown tip 33 of probe member 17 is additionally preferably coated with a hardened PdCo alloy, and the barrel spring 19 is preferably a high temperature rated coil spring.

FIGS. 3-7 set forth test results and parameters for the mechanical, electrical and high speed signal performance of the illustrated spring contact pin having the above exemplary dimensions and fabricate of the above suggested materials.

FIG. 3 shows the measured electrical resistance across eight spring contact pins of an IC test socket having spring contact pins in accordance with illustrated embodiment of the invention as a function of the displacement (in millimeters) of the depressible probe member of the contact pins. As shown in FIG. 3, resistance (shown in ohms) is very consistent during the entire compress and release cycle of the probe member 15, with little variation in the resistance between contact pins. By removing any potential for mechanical contact between probe member 15 and the edge 24 of barrel end opening 23, the contact between the probe member and spring barrel is confined to cylindrical walls 37 of the base end 34 of the probe member, allowing for a more controlled current path through the spring contact pin.

Figure 4:
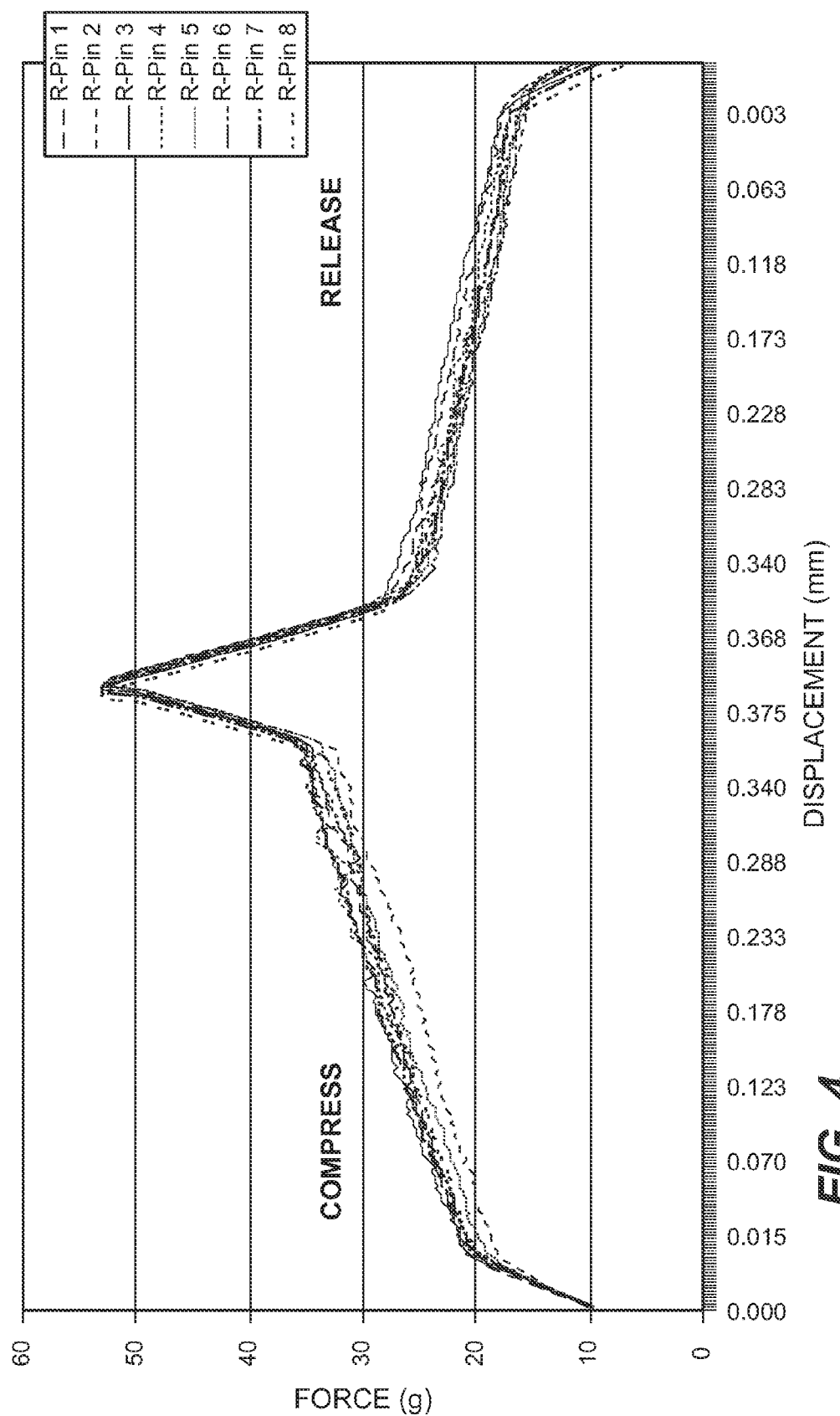
FIG. 4 is a graph showing measured force as a function of the displacement of depressible probe member of spring contact pins in accordance with the invention.

The graph in FIG. 4 shows measured force (in grams) as a function of the displacement (in millimeters) of the probe member 15 for eight spring contact pins of an IC test socket that are pre-loaded to a force of about 10 grams. The force profile for each of the pins is seen to be very consistent from pin to pin, with a peak in the force profile occurring at the maximum compression of the probe member (at about 0.375 mm from its pre-load displacement). Such a consistent and repeatable force profile is achieved by the unique tapered design the projecting end 35 of probe member 15, which eliminates a source of frictional force that can produce inconsistent results and that degrades the amount of force that is deliverable to the test or burn-in board conductor pads.

Figure 5:
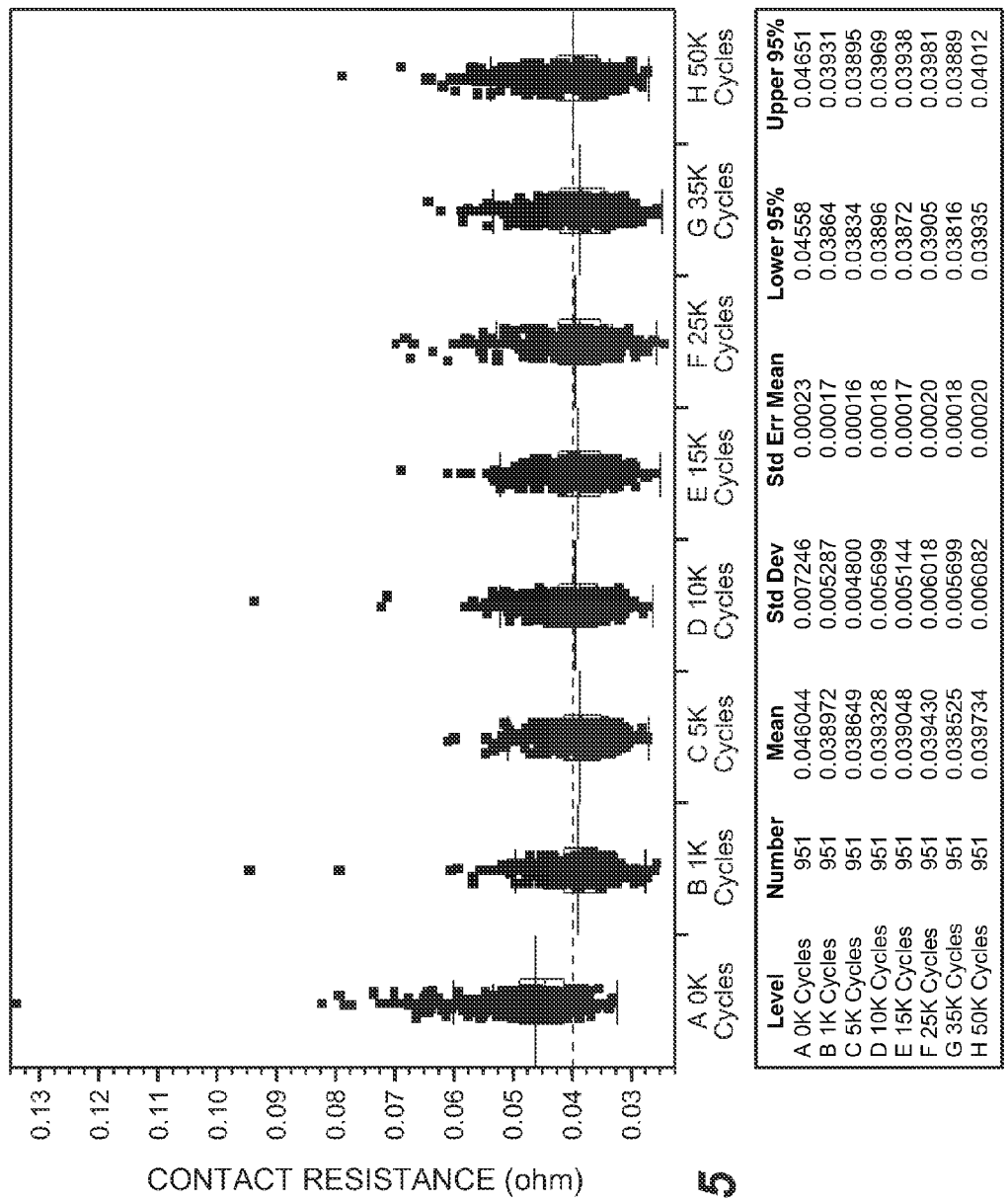
FIG. 5 is a graph illustrating measured deviations in the contact resistance after multiple cycles for multiple spring contact pins in accordance with the invention.

FIG. 5 is a graph illustrating measured deviations in the contact resistance (in ohms) after multiple cycles for multiple spring contact pins in accordance with the invention. The electrical resistance across 951 spring contact pins in accordance with the illustrated and described embodiment of the invention were measured before the pins were put through compression and release cycles and re-measured at after a number of cycles ranging from 1000 cycles to 50,000 cycles. The results are chartered on the contact resistance versus cycles graph in FIG. 5 and mean and standard deviations (in ohms) and standard error mean calculations for the measurements the 951 pins at each level of cycling presented in the table below the graph. These measurements show highly consistent and repeated pin performance over the lifetime of the spring contact pins.

Figure 7:
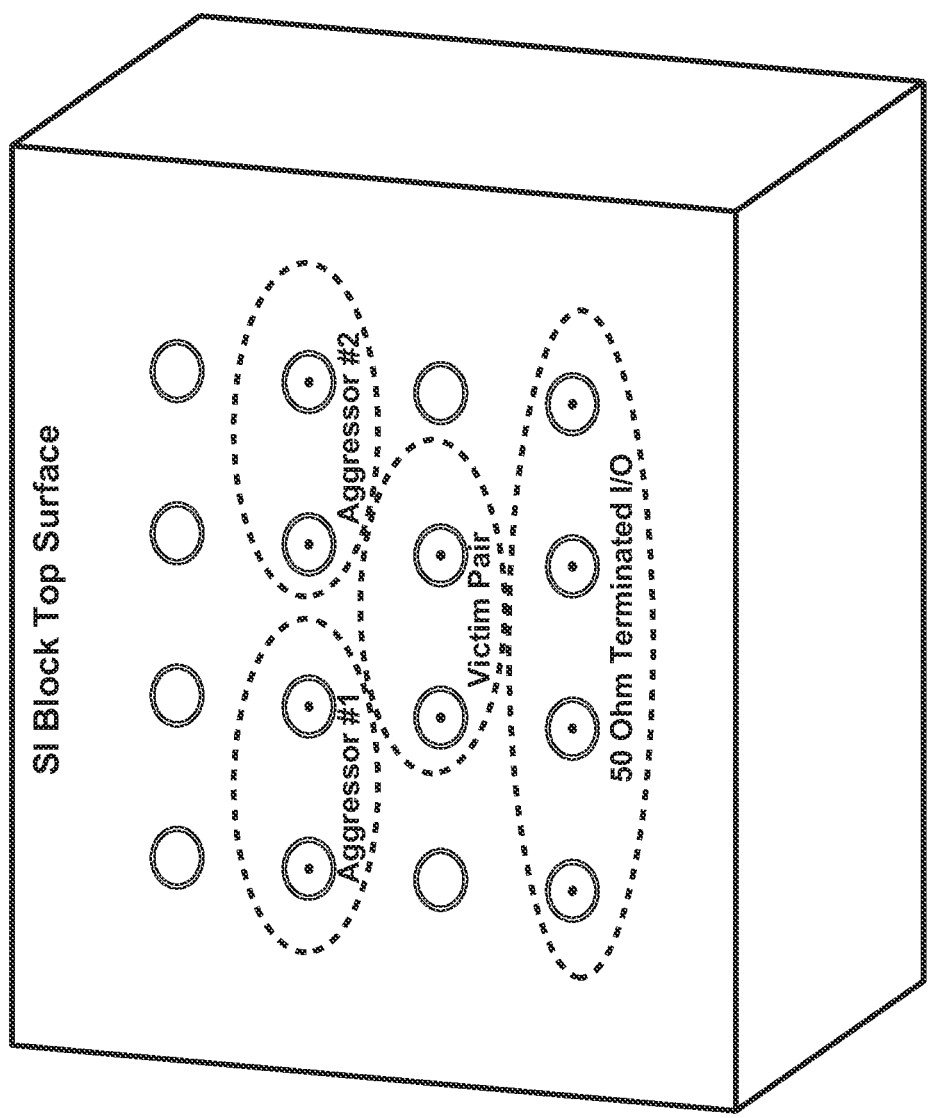
FIG. 7 is a diagrammatic top view of a signal integrity (SI) block of the type used to determine such high frequency signal performance.

FIG. 6 presents data for the high frequency signal performance of IC test sockets using spring contact pins in accordance with the invention for IC device packages having a package pitch (spacing between the spring contact pins) ranging from 0.5 mm to 1.0 mm for different high frequency applications ranging from 3.2 GHz to 10.0 GHz. FIG. 7 is a diagrammatic top view of a signal integrity (SI) block of the type used to generate the high frequency signal performance data tabulated in FIG. 6. The data is seen to include measured insertion loss, return loss, near end crosstalk and far end crosstalk at the different application frequencies, reveal the high speed signal transfer capabilities of the spring contact pins disclosed in the illustrated embodiment for most of the indicated IC package pitches within the indicated high frequency ranges. For example, a return loss (RL) of −13 db is considered to be good performance for an IC test socket used in high frequency application. Generally, a return loss of −8 db or greater would be considered unacceptable.

While the invention has described in considerable detail in the forgoing specification and the accompanying drawings, it will be understood that it is not intended that the invention be limited to such detail unless expressly indicated. It will be appreciated that embodiments of the invention other than illustrated and described would possible from the disclosure provided herein.

What we claim is:

1. A spring contact pin for an IC chip tester comprising
a conductive spring barrel having a first barrel end and a second barrel end, said first barrel end having a barrel end opening,
a compression spring in said spring barrel,
a first conductive probe member projecting from the first barrel end of said spring barrel and being depressible into said spring barrel against said compression spring from a fully extended position to a compressed position, said first conductive probe member having an enlarged base end captured within the spring barrel and a projecting end terminating at a probe tip, said projecting end extending from said base end through the barrel end opening at the spring barrel's first barrel end and having sidewalls that taper in the direction of said probe tip from a position within said spring barrel and that continue to taper from said position within the spring barrel as the projecting end of the probe member enters the barrel end opening at the first barrel end of the spring barrel so as to prevent contact between the sidewalls of the probe member's projecting end and the first barrel end of said spring barrel as the first probe member moves between its fully extended and compressed positions, and
a second conductive probe member projecting from the second barrel end of said spring barrel.

2. The spring contact pin of claim 1 wherein the sidewalls of the projecting end of said first probe member taper for substantially the entire length of said projecting end from the base end of the first probe member to the tip of the projecting end.

3. The spring contact pin of claim 1 wherein the sidewalls of the projecting end of said first probe member taper at substantially a uniform rate beginning at a position within said spring barrel.

4. The spring contact pin of claim 1 wherein the taper of the sidewalls of the projecting end of said first probe member begins substantially at the first probe member's enlarged base end and continues substantially to the tip thereof.

5. The spring contact pin of claim 1 wherein
the barrel end opening at the first barrel end of said spring barrel is formed by an inwardly projecting portion of said first barrel end, said inwardly projecting portion forming an inwardly projecting wall in the spring barrel at said first barrel end,
the enlarged base end of the first probe member has a forward shoulder that contacts the inwardly projecting wall at the first barrel end when the first probe member is fully extended, and
the taper of the sidewalls of the projecting end of said first probe member begins at the forward shoulder of the enlarged base end of the first probe member.

6. The spring contact pin of claim 5 wherein the forward shoulder of the base end of said first probe member terminates at a terminal point beyond the inwardly projecting portion of the first barrel end, and wherein the taper of the sidewalls of the projecting end of said first probe member begins at said terminal point.

7. The spring contact pin of claim 5 wherein said second probe member is a fixed probe.

8. A spring contact pin for an IC chip tester comprising
a conductive spring barrel having a barrel end with a barrel end opening,
a compression spring in said spring barrel, and
a conductive probe member projecting from the barrel end of said spring barrel and being depressible into said spring barrel against said compression spring from a fully extended position to a compressed position,
said probe member having a projecting end that extends through the barrel end opening in the barrel end of said spring barrel and that tapers from a position within the spring barrel wherein, when the projecting end is in its fully extended position, the taper of the projecting end of the probe member begins within the spring barrel and extends into said barrel end opening, and wherein
the projecting end of said probe member is tapered at substantially a uniform rate over substantially the entire length thereof,
the barrel end opening at the barrel end of said spring barrel is formed by an inwardly projecting portion of said barrel end, said inwardly projecting portion forming an inwardly projecting wall in the spring barrel at said barrel end, and
said probe member has an enlarged base end having a forward shoulder that contacts the inwardly projecting wall at the barrel end of said spring barrel, the taper of the projecting end of said probe member beginning substantially at the forward shoulder of the enlarged base end of the probe member.

9. A spring contact pin for an IC chip tester comprising
a conductive spring barrel having a first barrel end and a second barrel end, said first barrel end having a barrel end opening formed by an inwardly projecting portion of said first barrel end, said inwardly projecting portion forming an inwardly projecting wall in the spring barrel at said first barrel end,
a compression spring in said spring barrel,
a first conductive probe member projecting from the first barrel end of said spring barrel and being depressible into said spring barrel against said compression spring from a fully extended position to a compressed position, said first conductive probe member having an enlarged base end captured within the spring barrel and a projecting end terminating at a probe tip having a radius, said enlarged base end having a forward shoulder that contacts the inwardly projecting wall at the first barrel end of said spring barrel when the first probe member is in its fully extended position, the projecting end of said probe member extending from the forward shoulder of said base end through the barrel end opening at the spring barrel's first barrel end and being tapered from the forward shoulder of the base end of the probe member to the radius of said probe tip, and
a second conductive probe member projecting from the second barrel end of said spring barrel.

10. The spring contact pin of claim 9 wherein the forward shoulder of the base end of said first probe member has a radius.

11. The spring contact pin of claim 9 wherein said second probe member is a fixed probe.

* * * * *